United States Patent [19]
Keeth

[11] Patent Number: 5,852,378
[45] Date of Patent: Dec. 22, 1998

[54] LOW-SKEW DIFFERENTIAL SIGNAL CONVERTER

[75] Inventor: Brent Keeth, Boise, Id.

[73] Assignee: Micron Technology, Inc., Boise, Id.

[21] Appl. No.: 798,228

[22] Filed: Feb. 11, 1997

[51] Int. Cl.$^6$ .................................................. H03K 3/017
[52] U.S. Cl. ........................ 327/171; 327/161; 327/165; 327/259; 327/292; 327/295
[58] Field of Search .................................. 327/161, 165, 327/211, 212, 292, 295, 256, 407, 259, 171; 326/96

[56] References Cited

U.S. PATENT DOCUMENTS

| | | | |
|---|---|---|---|
| 4,508,983 | 4/1985 | Allgood et al. | 307/577 |
| 5,075,569 | 12/1991 | Branson | 327/407 |
| 5,239,206 | 8/1993 | Yanai | 307/272.2 |
| 5,272,729 | 12/1993 | Bechade et al. | 375/118 |
| 5,430,408 | 7/1995 | Ovens et al. | 327/407 |
| 5,563,546 | 10/1996 | Tsukada | 327/407 |

FOREIGN PATENT DOCUMENTS

WO 95/32549  11/1995  WIPO .

OTHER PUBLICATIONS

Satoru Tanoi, *Member, IEEE,* Tetsuya Tanabe, Kazuhiko Takahashi, Sanpei Miyamoto, and Masaru Uesugi "A 250–622 MHz Deskew and Jitter–Suppressed Clock Buffer Using Two–Loop Architecture", IEICE Trans, Electron, vol. E79 C. No. 7 Jul. 1996.

"Draft Standard for a High–Speed Memory Interface (SyncLink)", Microprocessor and Microcomputer Standards Subcommittee of the IEEE Computer Society, Copyright 1996 by the Institute of Electrical and Electronics Engineers, Inc., New York, NY, pp. 1–56.

*Primary Examiner*—Timothy P. Callahan
*Assistant Examiner*—Jung Ho Kim
*Attorney, Agent, or Firm*—Seed and Berry LLP

[57] ABSTRACT

A low-skew single-ended to differential signal converter includes a conventional single-ended to differential converter that drives a pair of output driver circuits. Each driver circuit is formed from a pair of transfer gates that receive a supply voltage or a reference voltage, respectively. The transfer gates transfer only a portion of the supply or reference voltage in response to the inverted signal from the conventional converter. The portion of the transferred voltage is insufficient to trigger output members in the output drivers and the output voltages from the drivers do not transition in response to the noninverted signal. The inverted signal causes the outputs of the transfer gates to transition fully, triggering the respective output inverters. Because the inverted signal causes transitions of both of the output signals, skew of the output signals is reduced relative to skew of the inverted and noninverted signals.

19 Claims, 7 Drawing Sheets

LOW-SKEW DIFFERENTIAL SIGNAL CONVERTER

TECHNICAL FIELD

The present invention relates to integrated circuit devices, and more particularly, to generation of differential signals in integrated circuit devices.

BACKGROUND OF THE INVENTION

Integrated circuit devices often receive single-ended clock signals, i.e., signals that vary between a low voltage and a high voltage and are referenced to a fixed reference voltage, typically either the low voltage or the high voltage. Such circuit devices then respond to whether the single-ended signal is above, below or equal to the reference voltage. However, for proper operation some circuits require differential input signals at a pair of terminals, i e., signals that vary in opposed fashion. Such circuits then respond to whether the first terminal is at a higher voltage than the second, or vice versa.

For example, delay stages in many delay-locked loops require high-speed, low-skew differential inputs for proper operation. Additionally, phase comparators in such delay-locked loops may also utilize differential input signals. Because integrated circuit devices that include such delay-locked loops often receive only single-ended signals, the single-ended signals often must be converted to differential signals.

One approach to converting a single-ended signal into a differential signal is shown in FIG. 1 where a single-ended signal CK is input to an inverter 40 to produce an inverted signal CK*. The noninverted and inverted signals CK, CK* are then output at a pair of terminals 42, 44 as a differential signal.

One problem with the above-described approach is that the output of the inverter 40 (i.e., the inverted signal CK*) is delayed relative to the input to he inverter 40 (the noninverted signal CK) by the response time of the inverter 40. As a consequence, the differential signals CK, CK* are "skewed," as shown in FIG. 2. One consequence of skew is that the signals CK, CK* do not cross the midpoint $V_{MID}$ at the same times. Instead, the midpoint crossings are offset by a skew time $T_d$, which is typically on the order of 50 picoseconds or more, even with a very fast inverter 40. Such skew times are unacceptable for some applications, such as very low jitter delaylocked loops and phase-locked loops. In such circuits, skewed input signals can cause instability, drift and jitter in the output signals. Consequently, it is desirable to produce differential signals from single-ended signals with lowered skew times.

SUMMARY OF THE INVENTION

A low-skew single-ended-to-differential signal converter is driven by a single-ended signal. The converter includes an inverter that produces an inverted version of the single-ended signal. The inverted and noninverted signals form a differential signal with a skew approximately equal to the response time of the inverter. The skewed inverted and noninverted signals drive output drivers that produce differential output signals with reduced skew as compared to the inverted and noninverted versions of the single-ended signal.

In one embodiment, the inverted signal drives a first input of a first output driver and a third input of a second output driver. The noninverted signal drives a second input of the first output driver and a fourth input of the second output driver. Output terminals of the first and second output drivers provide the differential signals.

The first output driver includes a first transfer gate formed by a complementary transistor pair coupled between a supply voltage and a first node. The first output driver also includes a second transfer gate formed from a second complementary transistor pair coupled between a reference voltage and the first node. The noninverted signal drives an NMOS transistor in the second transfer gate and a PMOS transistor switch in the first transfer gate. The inverted signal drives an NMOS transistor in the first transfer gate and a PMOS transistor in the second transfer gate.

Initially, the noninverted signal is low and the inverted signal is high. Under these conditions, the transistors in the first transfer gate are ON and the transistors in the second transfer gate are OFF. The first node voltage is thus high. A first output inverter coupled to the node outputs a low output signal in response.

The noninverted signal transitions from low to high first. In response to the transitioning noninverted signal the voltage at the first node begins dropping toward a voltage determined by the resistances of the two ON transistors. The node voltage does not fall below the threshold voltage of the first output inverter and the output of the first driver circuit remains low.

The inverted signal transitions low slightly after the noninverted signal transitions high and the first node voltage drops to the reference voltage. The first output inverter produces a high-going output signal in response.

The second output driver includes a third transfer gate formed from third complementary transistor pair and a fourth transfer gate formed from a fourth complementary transistor pair. The third transfer gate is coupled between a second node and a supply voltage and the fourth transfer gate is coupled between the reference voltage and the second node. However, connections to the third and fourth transfer gates are inverted relative to the connections to the first and second transfer gates so that the second node voltage is initially high. A second output inverter coupled to the second node produces a low output signal in response.

When the noninverted signal transitions high, the NMOS transistor in the third transfer gate turns ON and the PMOS transistor in the fourth transfer gate turns OFF raising the second node voltage. The second node voltage does not rise high enough to trigger the second output inverter, so the second output voltage remains low.

When the inverted signal transitions low, the second node voltage is pulled fully low and the second output signal goes high. Because transitions of the differential signal and the complementary differential signal are both activated by transitions of the same signal (the inverted signal), skew of the differential signals is reduced relative to skew of the inverted and noninverted signals.

DETAILED DESCRIPTION OF THE INVENTION

Figure 1:
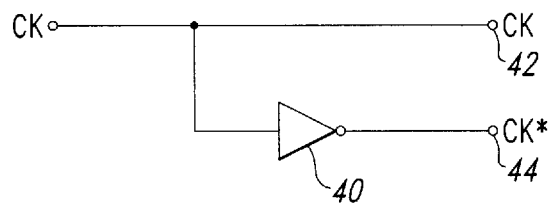
FIG. 1 is a schematic of a prior art single-ended-to-differential signal converter.
Figure 2:
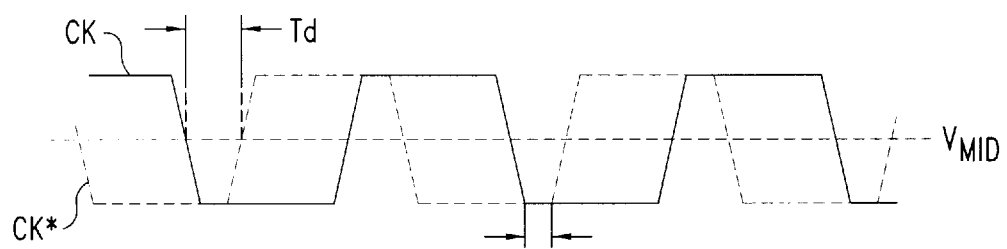
FIG. 2 is a signal timing diagram showing skewed outputs of the circuit of FIG. 1.
Figure 3:
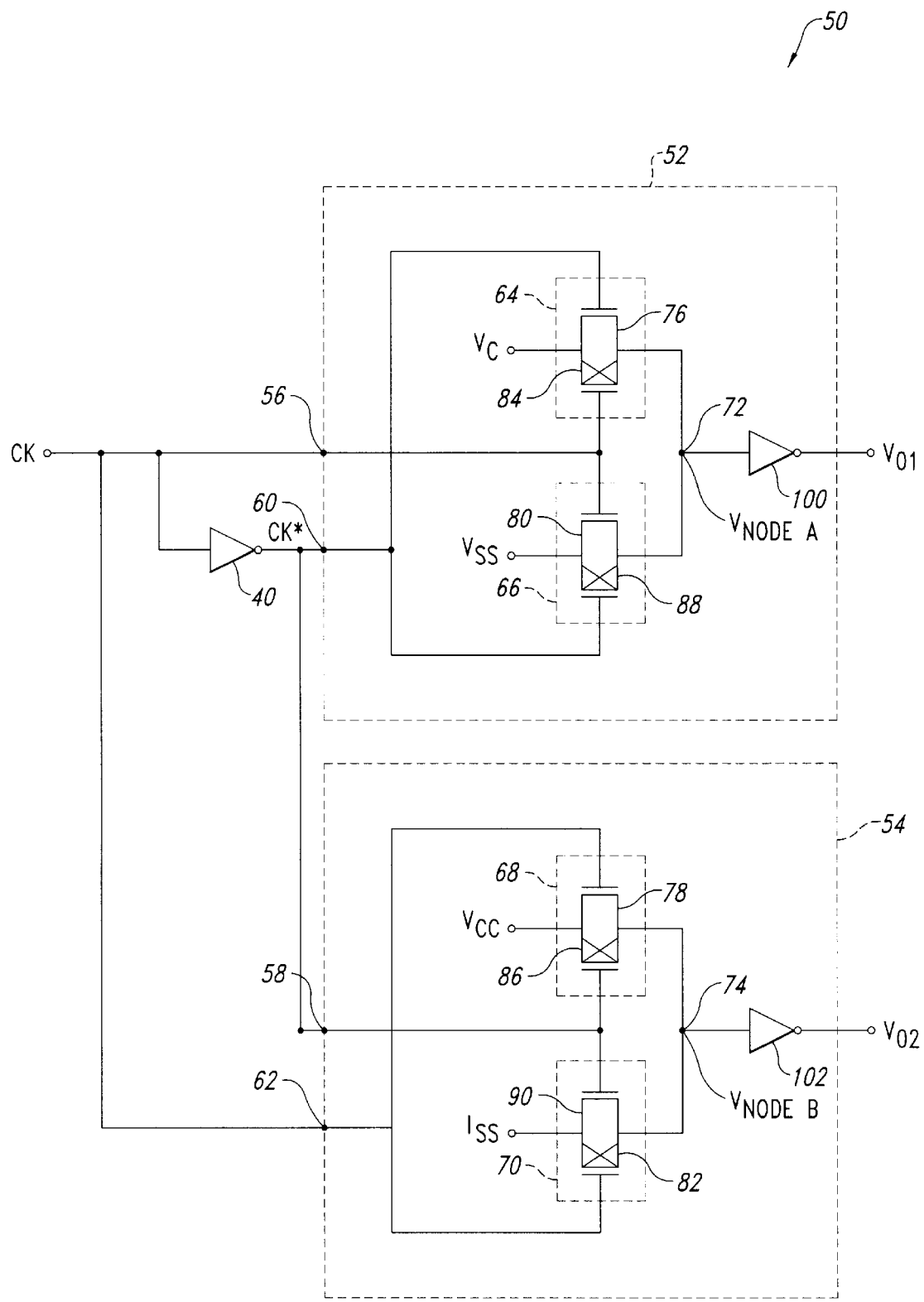
FIG. 3 is a schematic of a single-ended-to-differential signal converter according to one embodiment of the invention.

As shown in FIG. 3, a single-ended-to-differential signal converter 50 includes the inverter 40 of FIG. 1 and first and second driver circuits 52, 54 having respective noninverted inputs 56, 62 and inverted inputs 60, 58. The noninverted inputs 56, 62 are driven by the single-ended signal CK and the inverted inputs 60, 58 are driven by the inverted signal CK*.

Each of the driver circuits 52, 54 includes two transfer gates 64, 66, 68, 70. The outputs of the transfer gates 64, 66 in the first driver circuit 52 are connected to a first node 72 and the outputs of the transfer gates 68, 70 in the second driver 54 are connected to a second node 74. A signal input of the first transfer gate 64, 68 in each driver circuit 52, 54 receives a supply voltage $V_{CC}$ so that the first transfer gate 64, 68 in each driver circuit 52, 54 can couple the respective node 72, 74 to $V_{CC}$. The signal input of the second transfer gate 66, 70 in each driver circuit 52, 54 receives the reference voltage $V_{SS}$ so that the second transfer gate 66, 70 can couple the respective node 72, 74 to $V_{SS}$.

Each transfer gate 64, 66, 68, 70 includes an NMOS transistor 76, 78, 80, 90 coupled in parallel with a respective PMOS transistor 82, 84, 86, 88. The gates of the transistors 78, 80, 82, 84 are connected to the input of the inverter 40 so that the noninverted signal CK controls the transistors 78, 80, 82, 84. The gates of the transistors 76, 86, 88, 90 are connected to the output of the inverter 40 such that the inverted signal CK* controls the transistors 76, 86, 88, 90.

Figure 4:
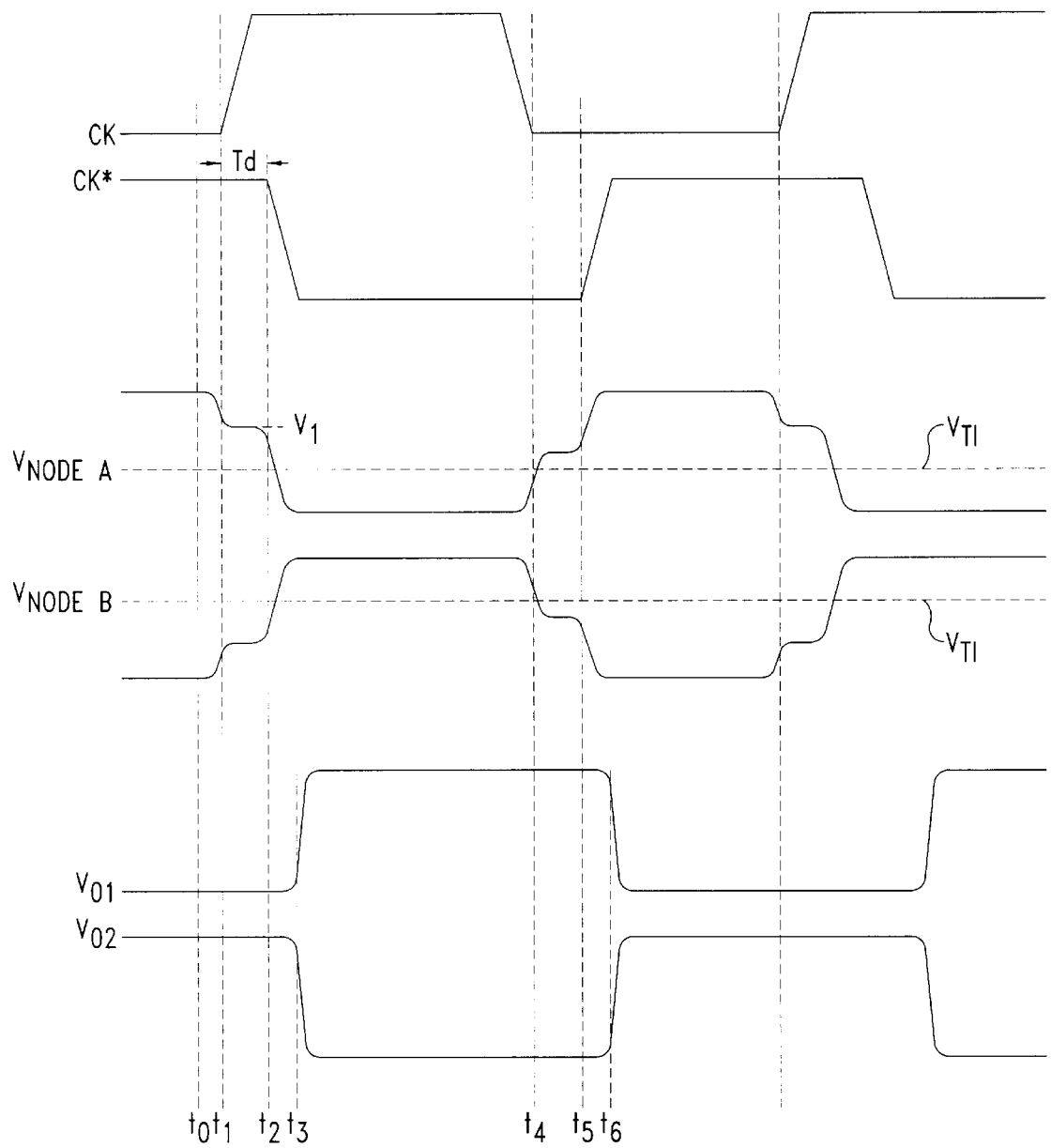
FIG. 4 is a signal timing diagram showing inverted and noninverted signals, node voltages and output voltages in the converter of FIG. 3.

The operation of the converter 50 of FIG. 3 will now be explained with reference to FIGS. 3, 4, 5A–B, and 6A–B. As shown in FIG. 4, at time $t_0$, the noninverted signal CK is low and thus holds the transistors 82, 84 ON and the transistors 78, 80 OFF. The inverted signal CK* is high and holds the transistors 76, 90 ON and the transistors 86, 88 OFF. Thus, at time $t_0$, the first output driver circuit 52 can be represented by the circuit equivalent shown in FIG. 5A where the OFF transistors 80, 88 are represented as open switches and the ON transistors 76, 84 are represented as closed switches. As shown in the third graph of FIG. 4, the voltage $V_{NODEA}$ of the first node 72 will equal the supply voltage $V_{CC}$. The high voltage $V_{NODEA}$ is inverted by an inverter 100 so that the output voltage $V_{O1}$ is equal to the reference voltage $V_{SS}$ at time to as shown in the fifth graph of FIG. 4. At time $t_0$, the second driver circuit 54 can be represented by the circuit equivalent of FIG. 6A where the OFF transistors 78, 86 are represented as open switches and the ON transistors 82, 90 are represented as closed switches. The voltage $V_{NODEB}$ of the second node 74 will be held to the reference voltage $V_{SS}$, as shown in the fourth graph of FIG. 4. The voltage $V_{NODEB}$ is inverted by an inverter 102 so that the output voltage $V_{O2}$ will equal the supply voltage $V_{CC}$ as shown in the sixth graph of FIG. 4.

At time $t_1$, the noninverted signal CK transitions from low to high, turning ON the transistors 78, 80 and turning OFF the transistors 82, 84. The inverted signal CK* lags the noninverted signal CK by the skew time $T_d$. A signal transition of the noninverted signal CK from low to high that begins at time $t_1$, does not produce a corresponding transition of the inverted signal CK* from high to low until time $t_2$ ($t_1+T_d$). Thus, the states of the transistors 76, 86, 88, 90 controlled by CK* do not change at time $t_1$.

Figure 5A:
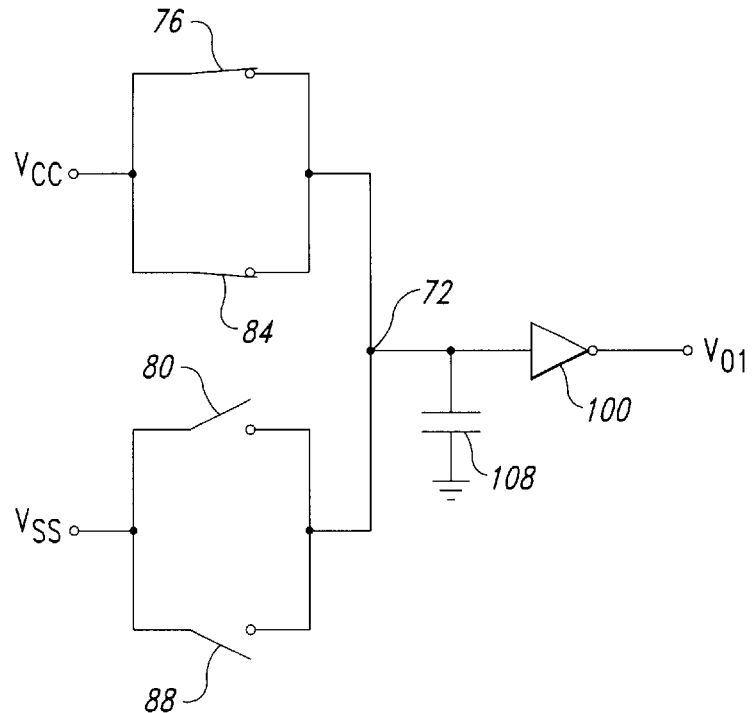
FIG. 5A is an equivalent circuit diagram of the first output driver in the single-ended-to-differential signal converter of FIG. 3 at time $t_0$.
Figure 5B:
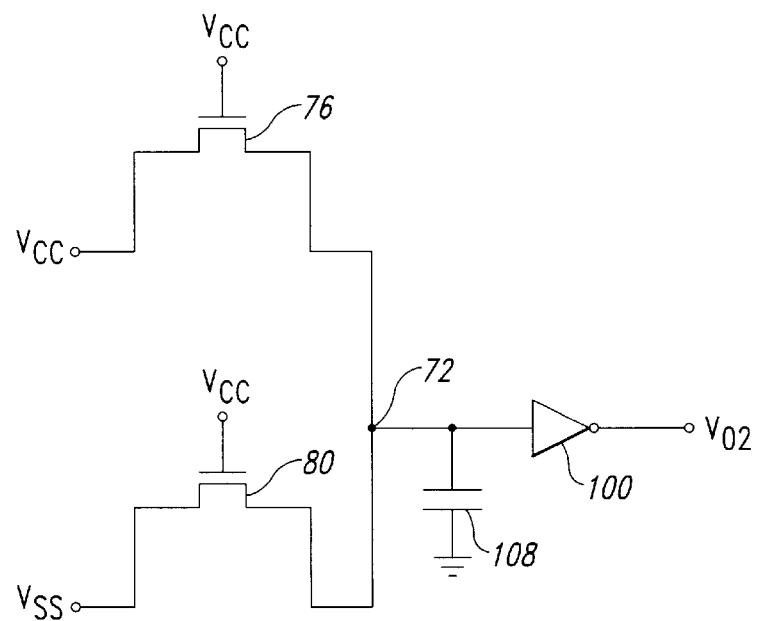
FIG. 5B is an equivalent circuit diagram of the first output driver in the single-ended-to-differential signal converter of FIG. 3 at time $t_1$.
Figure 6A:
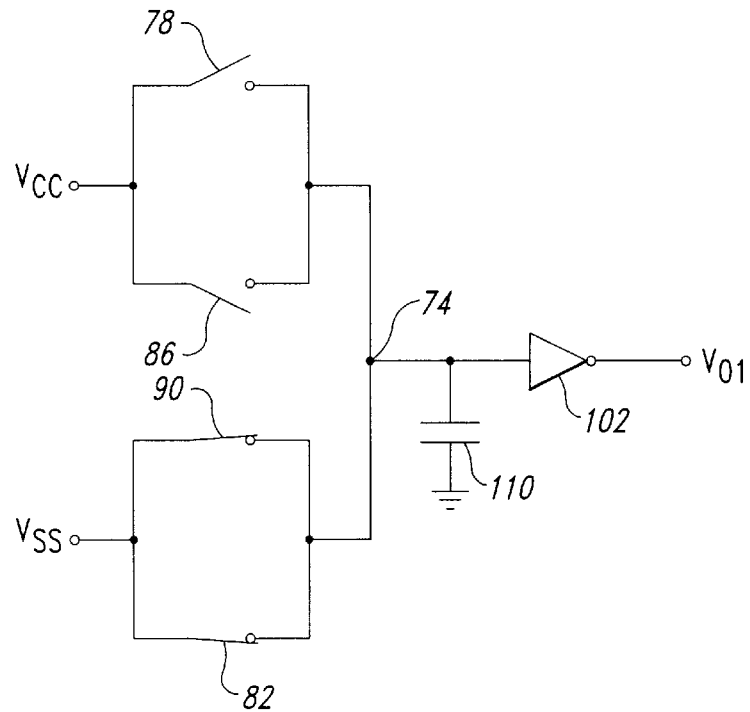
FIG. 6A is an equivalent circuit diagram of the second output driver of the single-ended-to-differential signal converter of FIG. 3 at time $t_0$.
Figure 6B:
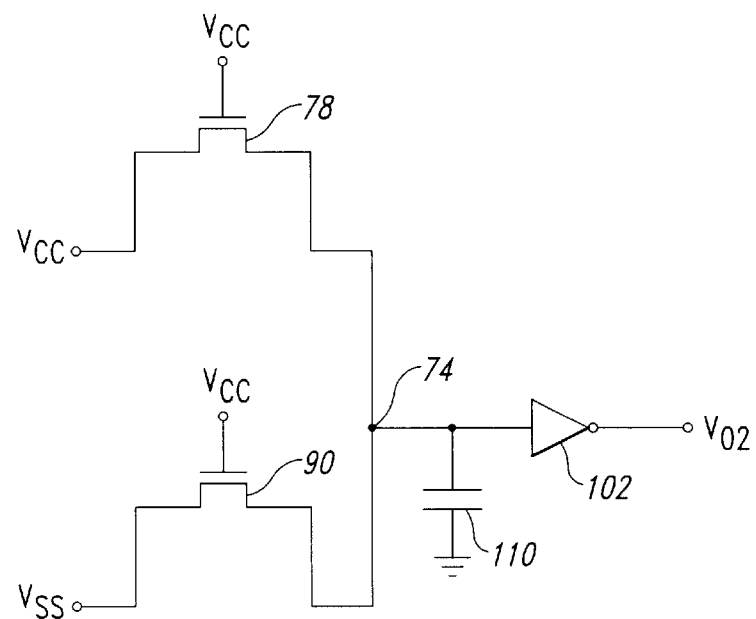
FIG. 6B is an equivalent circuit diagram of the second output driver of the single-ended-to-differential signal converter of FIG. 3 at time $t_1$.

Between times $t_1$ and $t_2$, the first driver circuit 52 can be represented as shown in FIG. 5B and the second driver 54 can be represented as shown in FIG. 6B, where the OFF transistors 82, 84, 86, 88 are removed for clarity. Considering only the first driver circuit 52 as represented by the equivalent circuit of FIG. 5B, the ON NMOS transistors 76, 80 establish the voltage $V_{NODEA}$ of the node 72 at a voltage $V_1$ as shown in the third graph of FIG. 4. The voltage $V_1$ is shown closer to the supply voltage $V_{CC}$ than the reference voltage $V_{SS}$, as will now be explained with reference to FIG. 5B.

When the noninverted signal CK transitions high, the gates of the transistors 76, 80 are coupled to the supply voltage $V_{CC}$. The gate to source voltage of the transistor 80 is equal to the difference between $V_{CC}$ and $V_{SS}$. Therefore, the transistor 80 turns ON and begins to pull the node voltage $V_{NODEA}$ down. The transistor 76 begins to conduct when the node voltage $V_{NODEA}$ becomes sufficiently low that the gate to source voltage of the transistor 76 exceeds the transistor's threshold voltage $V_{TN}$. If the gate voltages and other conditions remained constant, the node voltage $V_{NODEA}$ would eventually settle at a voltage determined by the channel resistances of the transistors 76, 80. In the preferred embodiment, the transistor 80 is selected with a higher channel resistance than the transistor 76. Therefore, the node voltage $V_{NODEA}$ remains above a threshold voltage $V_{TI}$ of the inverter 100 in response to the transition of the noninverted signal CK. The output voltage $V_{O1}$ thus does not transition in response to the transitioning noninverted signal CK at time $t_1$.

The response of the second driver circuit 54 at time $t_1$ is similar to the response of the first driver circuit 52. As noted above, when the noninverted signal CK transitions high, the transistor 78 turns ON and the transistor 82 turns OFF. The ON transistors 78, 90 form a voltage divider as shown in FIG. 6B. In the second driver circuit 54, the channel resistances of the transistors 78, 90 are selected such that the node voltage $V_{NODEB}$ rises less than halfway to $V_{CC}$ (i.e., below $V_{TI}$), as shown in the fourth graph of FIG. 4. Because the node voltage $V_{NODEB}$ remains below the threshold voltage $V_{TI}$ of the inverter 102, the output voltage $V_{O2}$ remains high.

At time $t_2$, the inverted signal CK* transitions from high to low.

The transitioning inverted signal CK* turns OFF the transistors 76, 90 and turns ON the transistors 86, 88. In the first driver circuit 52, both transistors 76, 84 in the first transfer gate 64 are thus OFF and both transistors 80, 88 in the second transfer gate 66 are ON. Thus, the node voltage $V_{NODEA}$ is pulled below the threshold voltage $V_{TI}$ of the inverter 100 at time $t_2$ and the output voltage $V_{O1}$ transitions high at time $t_3$, which is slightly after time $t_2$ due to the delay of the inverter 100.

Referring to the second driver circuit 54, when the transitioning inverted signal CK* turns ON the transistor 86 and turns OFF the transistor 90, both transistors 78, 86 in the first transfer gate 68 of the second driver 54 are ON and both transistors 90, 82 in the second transfer gate 70 are OFF. Therefore, the node voltage $V_{NODEB}$ rises to $V_{CC}$ at time $t_2$. As shown in the, sixth graph of FIG. 4, the inverter 102 responds by sending the output voltage $V_{O2}$ low at time $t_3$, which is slightly after time $t_2$ due to the delay of the inverter 102. Because both of the output signals $V_{O1}$, $V_{O2}$ transition in response to the transition of the inverted signal CK*, both output signals $V_{O1}$, $V_{O2}$ transition at time $t_3$. Skew between the output signals $V_{O1}$, $V_{O2}$ is thus reduced relative to the inverted and noninverted signals CK*, CK.

At time $t_4$, the noninverted signal CK transitions from high to low, tuning OFF the transistors 80, 78 and turning ON the transistors 84, 82. In the first driver circuit, the ON PMOS transistors 84, 88 form a voltage divider between the supply voltage $V_{CC}$ and the reference voltage $V_{SS}$. The transistor 88 is selected with a lower channel resistance than the transistor 84, so that the node voltage $V_{NODEA}$ does not rise above the threshold voltage $V_{TI}$ of the inverter 100. Therefore, the inverter 100 does not produce a transition at time $t_4$.

In the second driver circuit 54, the ON PMOS transistors 82, 86 form a voltage divider between $V_{CC}$ and $V_{SS}$ and the node voltage $V_{NODEB}$ falls. The transistor 82 is selected with a higher channel resistance than the transistor 86. Therefore, the voltage $V_{NODEB}$ remains above the threshold voltage $V_{TI}$ of he inverter 102 and the output voltage $V_{O2}$ remains low at time $t_4$.

When the inverted signal CK* transitions from low to high at time $t_5$, the transistors 76, 90 turn ON and the transistors 86, 88 turn OFF. The first node 72 is thus coupled to $V_{CC}$ and the second node 74 is coupled to $V_{SS}$. As the node voltage $V_{NODEA}$ rises, it triggers the output inverter 100 and the output voltage $V_{O1}$ returns low at time $t_6$, which is slightly after time $t_5$ due to delay of the inverter 100. Similarly, the second node is coupled to $V_{SS}$ by the ON transistors 82, 90, pulling down the second node voltage $V_{NODEB}$. The falling node voltage $V_{NODEB}$ triggers the inverter 102 at time $t_5$ and the output voltage $V_{O2}$ goes high at time $t_6$.

The exemplary embodiment above employs transistors 76, 78, 80, 82, 84, 86, 88, 90 that have channel resistances selected to delay triggering the output inverters 100, 102 until the inverted signal CK* transitions. However, one skilled in the art will recognize that, at high frequencies, the driver circuits 52, 54 will reduce skew even if the transistors 76, 78, 80, 82, 84, 86, 88, 90 in each voltage divider have equal channel resistances. This can be seen by considering the capacitive loading of the inverters 100, 102, represented as discrete capacitors 108, 110 in the equivalent circuits of FIGS. 5A–B, 6A–B.

Returning to time $t_1$, when the transistors 78, 80 turn ON and the transistors 82, 84 turn OFF, the node voltage $V_{NODEA}$ does not immediately change, due to the capacitor 108. Instead, the node voltage $V_{NODEA}$ falls exponentially as the capacitor 108 discharges charges through the channel resistance of the transistor 80 (and some of the charge is replaced through the channel resistance of the transistor 76). Thus, the node voltage $V_{NODEA}$ would not immediately trigger the output inverter 100 at time $t_1$, even if the channel resistances were equal. The output transition will be therefore delayed toward time $t_2$. Similarly, the capacitor 110 slows development of the voltage $V_{NODEB}$ at the second node 74, thereby delaying response of the inverter 102 toward time $t_2$.

At time $t_2$, the node voltages VNODEA, $V_{NODEB}$ are quickly pulled high and low respectively by the ON transistors 80, 88, 78, 86, ensuring triggering of the inverters 100, 102 at or very shortly after time $t_2$. Thus, even if the channel resistances of the transistors 76, 78, 80, 82, 84, 86, 88, 90 were equal, the output signals $V_{O1}$, $V_{O2}$ would transition very close to time $t_3$. Consequently, the signal converter 50 improves skew even for equal channel resistances.

Figure 7:
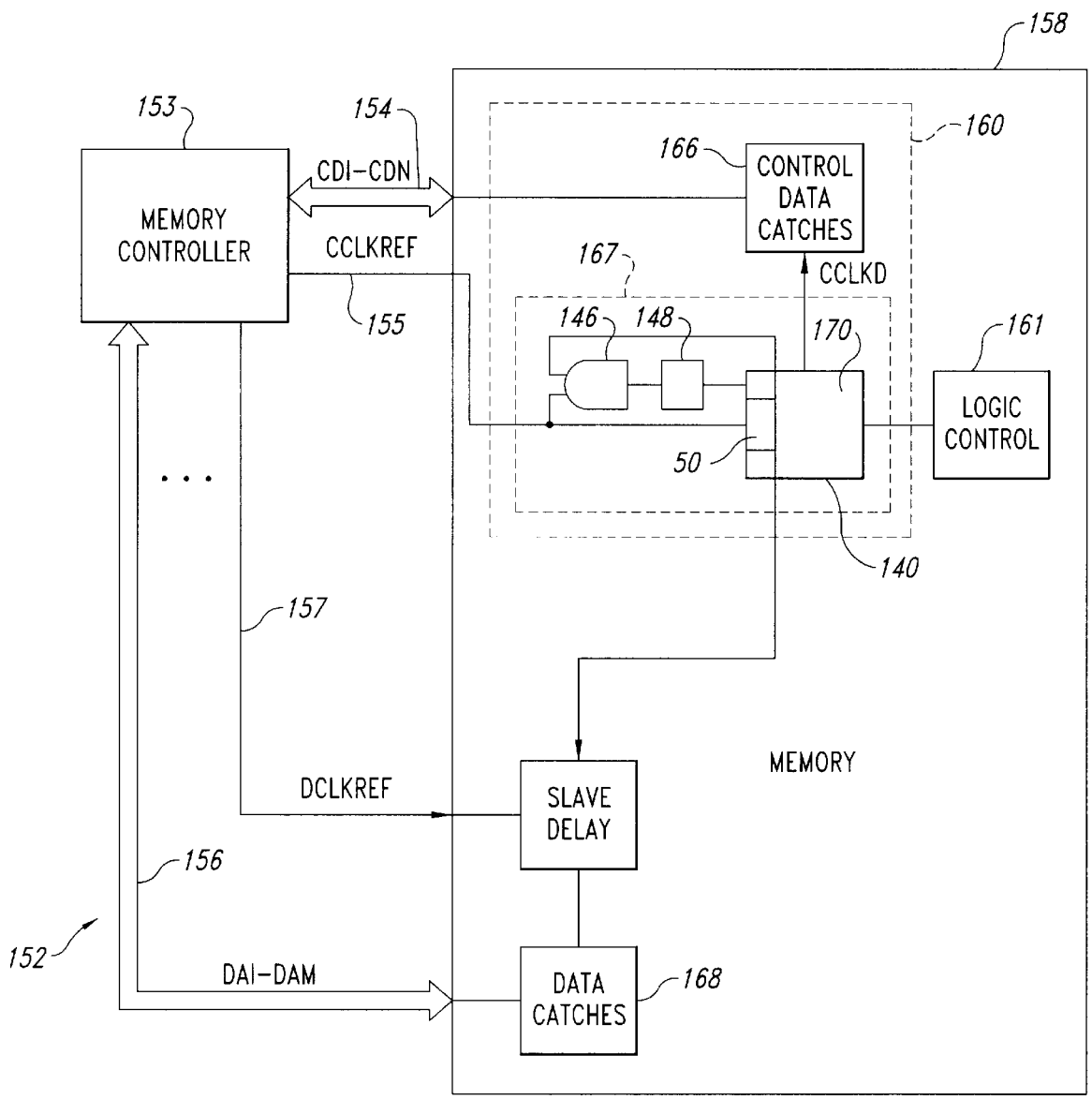
FIG. 7 is a block diagram of a memory system including a memory device that includes the converter of FIG. 3.

As shown in FIG. 7, a memory system 152 includes a memory device 158 containing the converter 50 that operates under control of a memory controller 153. The memory controller 153 controls the memory device 158 through control data CD1–CDN and a single-ended reference clock signal CCLKREF, carried by a control data bus 154 and a clock bus 155, respectively. The memory controller 153 provides data DA1–DAM to the memory device 158, synchronously with a data clock signal DCLKREF over a data bus 156 and a data clock bus 157, respectively.

The memory device 158 includes a latching circuit 160 that operates under control of a logic control circuit 161. The latching circuit 160 is formed from a delay-locked loop 162 and control data latches 166. The control data latches 166 receive control data CD1–CDN from the control data bus 154 and data latches 168 receive data DA1–DAM from the data bus 156. Additionally, the latching circuit 160 receives the reference control clock signal CCLKREF and the reference data clock signal DCLKREF from the respective clock buses 155, 157.

The reference control clock signal CCLKREF is a single-ended continuous clock signal that drives the delay-locked loop 162 at a frequency $f_{CCLK}$. The delay-locked loop 162 is formed from a variable delay circuit 140, a comparator 146, and an integrator 148. The variable delay circuit 140 is formed from the converter 50 of FIG. 3 and a multitap variable delay line 170. The converter 50 converts the single-ended reference control clock signal CCLKREF to a differential signal for use by the delay line 170. The delay line 170 delays the differential reference control clock signal CCLKREF, thereby providing several delayed clock signals CCLK1–CCLKN, each at the frequency $f_{CCLK}$ and each delayed by a respective time delay relative to the reference control clock signal CCLKREF to form a delayed reference clock signal CCLKD. The delayed reference clock signal CCLKD activates control data latches 166, thereby latching control data CD1–CDN. The latched control data CD1–CDN is then made available to the logic control circuit 161.

Figure 8:
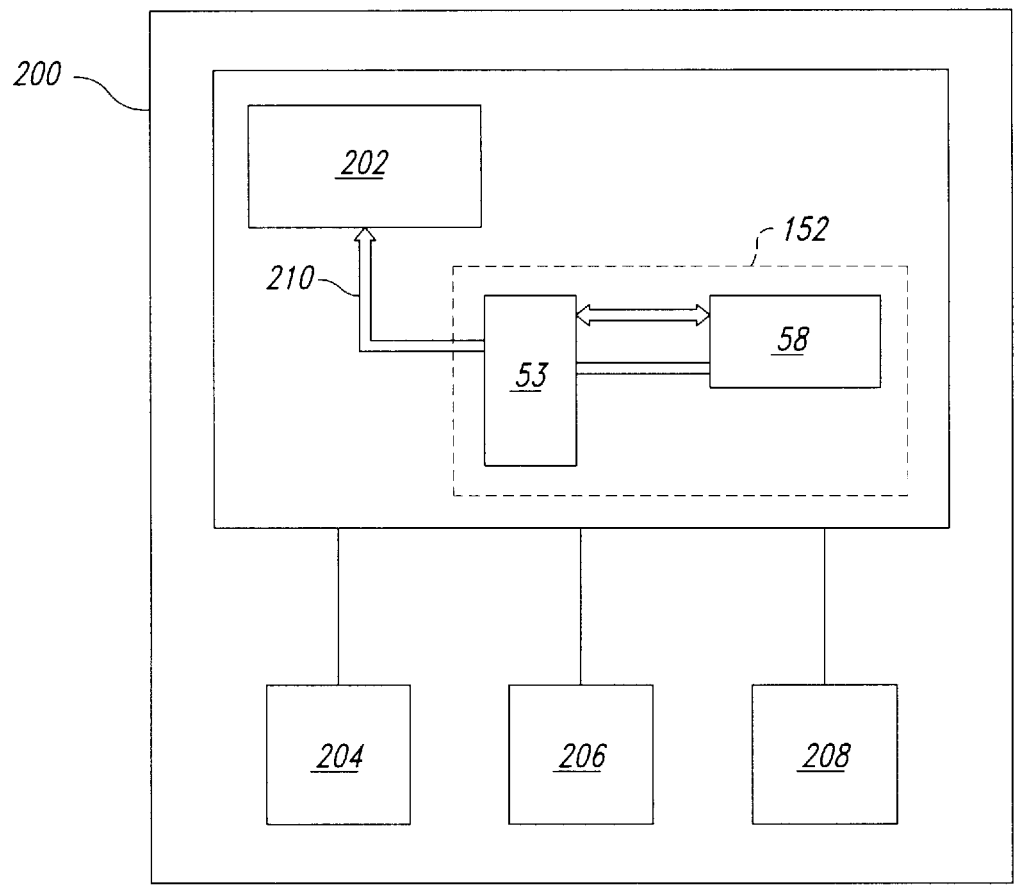
FIG. 8 is a block diagram of a computer system that includes the memory system of FIG. 7.

FIG. 8 is a block diagram of a computer system 200 that contains the memory system 152 of FIG. 7. The computer system 200 includes a processor 202 for performing computer finctions such as executing software to perform desired calculations and tasks. The processor 202 also includes command, address and data buses 210 to activate the memory system 152. One or more input devices 204, such as a keypad or a mouse, are coupled to the processor 202 and allow an operator to manually input data thereto. One or more output devices 206 are coupled to the processor 202 to display or otherwise input data generated by the processor 202. Examples of output devices include a printer and a video display unit. One or more data storage devices 208 are coupled to the processor to store data on or retrieve data from external storage media (not shown). Examples of storage devices 208 and storage media include drives that accept hard and floppy disks, tape cassettes and compact-disc read-only memories.

From the foregoing it will be appreciated that, although specific embodiments of the invention have been described herein for purposes of illustration, various modifications may be made without deviating from the spirit and scope of the invention. Accordingly, the invention is not limited except as by the appended claims.

I claim:

1. A signal converter for producing low skew first and second differential output signals in response to skewed first and second differential input signals, comprising:

a supply terminal adapted to receive a supply voltage;

a first switching circuit coupled between the supply terminal and a first circuit node, the first switching circuit having first and second switching terminals for receiving the first and second skewed differential input signals, respectively, the first switching circuit having a first switch state in which the first switching circuit couples the supply terminal to the first circuit node and a second state in which the first switching circuit isolates the first circuit node from the supply terminal, the first switching circuit being responsive to switch between the first and second states in response to both of the first and second switching terminals changing voltages;

a reference terminal adapted to receive a reference voltage; and a second switching circuit coupled between the reference terminal and the first circuit node, the second switching circuit having third and fourth switching terminals coupled to the second and first switching terminals, respectively, the second switching circuit having a first switch state in which the second switching circuit couples the reference terminal to the first circuit node and a second state in which the second switching circuit isolates the reference terminal from the first circuit node, the second switching circuit being responsive to switch from the first state to the second state in response to both of the first and second terminals changing voltages.

2. The signal converter of claim 1, further comprising an output buffer having an input coupled to the first circuit node and an output.

3. The signal converter of claim 2 wherein the buffer is an inverter.

4. The signal converter of claim 2 wherein the buffer includes a trigger voltage wherein the first and second switching circuits each include an intermediate state in which the first switching circuit couples the first circuit node to the supply terminal and the second switching circuit couples the first circuit node to the reference terminal wherein the first and second switching circuits have respective resistances in the intermediate states.

5. The signal converter of claim 4 wherein the resistance of the first switching circuit is greater than the resistance of the second switching circuit.

6. A differential signal converter for producing low skew differential signals in response to a single-ended signal, comprising:

an initial converter circuit having an input terminal adapted to receive the single-ended signal and a pair of differential output terminals, the initial converter circuit being responsive to the single-ended signal to produce first and second complementary intermediate signals at the respective differential output terminals, the second intermediate signal having a skew relative to the first intermediate signal;

a first driver circuit having a first input terminal coupled to a first of the differential output terminals and a second input terminal coupled to a second of the differential output terminals, the first driver circuit being responsive to a transition both of the first and second intermediate signals to produce a first differential output signal; and a second driver circuit having a first input terminal coupled to the second differential output terminal and a second input terminal coupled to the first differential output terminal, the second driver circuit being responsive to produce a second differential output signal in response to the transition of both of the first and second intermediate signals, the second differential output signal having a skew relative to the first differential output signal that is less than the skew of the second intermediate signal relative to the first intermediate signal.

7. The signal converter of claim 6 wherein the first driver circuit includes:

a supply terminal adapted for coupling to a supply voltage;

a first transfer gate coupled between a supply terminal and a first node, the first transfer gate having a first control input coupled to the first differential output terminal and a second control input coupled to the second differential output terminal, the first transfer gate being responsive to couple the first circuit node to the supply terminal in response to the transition of both of the first and second intermediate signals;

a reference terminal adapted for coupling to a reference voltage; and a second transfer gate coupled between the reference terminal and the first node, the second transfer gate having a first control input coupled to the second differential output terminal and a second input coupled to the first differential output terminal, the second transfer gate being responsive to isolate the reference node from the first node in response to the transition of both of the first and second itermediate signals.

8. The signal converter of claim 7 wherein the second driver circuit includes:

a third transfer gate coupled between the supply terminal and a second node, the third transfer gate having a first control input coupled to the second differential output terminal; and a fourth transfer gate coupled between the reference terminal and the second node, the fourth transfer gate having a first control input coupled to the first differential output terminal.

9. The signal converter of claim 8 wherein the first driver circuit further includes a first buffer circuit having an input coupled to the first node.

10. The signal converter of claim 9 wherein the second driver circuit further includes a second buffer circuit having an input coupled to the second node.

11. A low-skew differential clock generator circuit, comprising:

a single-ended clock generator configured to provide a driving signal at a driving output;

an inverter having an inverter input coupled to the driving output, the inverter having an inverter output coupled for providing an inverted driving signal in response to the driving signal;

a first transfer gate having a first signal input, a first signal output, a first noninverted control input coupled to the inverter output and a first inverted control input coupled to the driving output;

a second transfer gate having a second signal input, a second signal output, a second noninverted control input coupled to the driving output and a second inverted control input coupled to the inverter output;

a third transfer gate having a third signal input, a third signal output, a third noninverted control input coupled to the inverter output and a third inverted control input coupled to the driving output;

a fourth transfer gate having a fourth signal input, a fourth signal output, a fourth noninverted control input coupled to the driving output and a fourth inverted control input coupled to the inverter output;

a first voltage source coupled to the first and fourth signal inputs; and a second voltage source coupled to the second and third signal inputs.

12. The clock generator circuit of claim 11 wherein the first signal output is coupled to the second signal output at a first node.

13. The clock generator circuit of claim 12 wherein the third signal output is coupled to the fourth signal output at a second node.

14. The clock generator circuit of claim 13, frther comprising a first buffer having an input coupled to the first node.

15. The clock generator circuit of claim 13, further comprising a second buffer having an input coupled to the second node.

16. A method of reducing skew in first and second complementary signals, the method comprising the steps of:

coupling a first circuit node to a supply voltage in response to the first and second signals having a first and second states, respectively;

coupling the first circuit node to a reference voltage in response to the first and second signals having second and first states, respectively; and driving the first circuit node to a first intermediate voltage between the supply and reference voltage in response to both of the first and second signals having the first state.

17. The method of claim 16 wherein the step of driving the first circuit node to an intermediate voltage includes the step of forming a voltage divider between the supply and reference voltages.

18. The method of claim 16 further comprising the step of producing an output signal in response to the first node voltage exceeding a trigger voltage greater than the first intermediate voltage.

19. The method of claim 18 furter comprising the step of driving the first circuit node to a second intermediate voltage below the trigger voltage in response to the first and second signals having the second state.

* * * * *